(12) United States Patent
Sohn et al.

(10) Patent No.: US 9,318,828 B2
(45) Date of Patent: Apr. 19, 2016

(54) CONTACT PIN AND POWER MODULE PACKAGE HAVING THE SAME

(71) Applicant: SAMSUNG ELECTRO-MECHANICS CO., LTD., Suwon (KR)

(72) Inventors: Young Ho Sohn, Suwon (KR); Eun Jung Jo, Suwon (KR); Jae Hyun Lim, Suwon (KR); Tae Hyun Kim, Suwon (KR)

(73) Assignee: Samsung Electro-Mechanics Co., Ltd., Gyunggi-Do (KR)

( * ) Notice: Subject to any disclaimer, the term of this patent is extended or adjusted under 35 U.S.C. 154(b) by 197 days.

(21) Appl. No.: 14/091,228

(22) Filed: Nov. 26, 2013

(65) Prior Publication Data

US 2014/0146487 A1 May 29, 2014

(30) Foreign Application Priority Data

Nov. 27, 2012 (KR) ........................ 10-2012-0135392

(51) Int. Cl.
*H05K 7/00* (2006.01)
*H01R 13/17* (2006.01)
*H01R 13/08* (2006.01)
*H01L 23/00* (2006.01)
*H01R 12/71* (2011.01)
*H01R 12/73* (2011.01)

(52) U.S. Cl.
CPC ................ *H01R 13/17* (2013.01); *H01L 24/72* (2013.01); *H01R 13/08* (2013.01); *H01L 2924/1305* (2013.01); *H01L 2924/13034* (2013.01); *H01L 2924/13055* (2013.01); *H01L 2924/13091* (2013.01); *H01L 2924/15787* (2013.01); *H01R 12/714* (2013.01); *H01R 12/73* (2013.01)

(58) Field of Classification Search
CPC ................... H01L 2924/00; H01L 2924/1305; H01L 2924/13055; H01L 2924/13091; H01L 2924/15787; H01L 24/72; H01L 2924/13034; H01R 12/714; H01R 12/73; H01R 13/08; H01R 13/17
USPC ......... 361/728, 735, 736, 764, 767, 781, 783; 174/250–262
See application file for complete search history.

(56) References Cited

U.S. PATENT DOCUMENTS 5,610,493 A * 3/1997 Wieloch ........................ 318/801
5,920,119 A    7/1999 Tamba et al.
(Continued)

FOREIGN PATENT DOCUMENTS

CN    101859753    10/2010
CN    102074825    5/2011
(Continued)

OTHER PUBLICATIONS

Office action dated Jan. 17, 2014 from Korean Patent Application No. 10-2012-0135392 and an English summary thereof.
(Continued)

*Primary Examiner* — Yuriy Semenenko
(74) *Attorney, Agent, or Firm* — Ladas & Parry, LLP

(57) ABSTRACT

Disclosed herein is a contact pin including: a deformation part elastically deformed; connection parts coupled to both ends of the deformation part; and contact parts coupled to the connection parts coupled to both ends of the deformation part, respectively, and having one end coupled to the connection part and the other end.

12 Claims, 4 Drawing Sheets

(56) References Cited

U.S. PATENT DOCUMENTS

| | | | | |
|---|---|---|---|---|
| 6,046,597 | A | * | 4/2000 | Barabi ................... 324/756.02 |
| 2010/0258935 | A1 | | 10/2010 | Knebel et al. |
| 2010/0295172 | A1 | * | 11/2010 | Gao et al. ................... 257/712 |
| 2011/0095779 | A1 | | 4/2011 | Washio et al. |

FOREIGN PATENT DOCUMENTS

| | | |
|---|---|---|
| CN | 102446866 | 5/2012 |
| KR | 10-2010-0045041 | 5/2010 |
| KR | 10-2011-0044143 | 4/2011 |
| KR | 10-2011-0115080 | 10/2011 |

OTHER PUBLICATIONS

Office Action dated Feb. 1, 2016 for Chinese Patent Application No. 201310616289.5 and its English translation provided by Applicant's foreign counsel.

* cited by examiner (a)  (b)

(a)  (b)

CONTACT PIN AND POWER MODULE PACKAGE HAVING THE SAME

CROSS REFERENCE TO RELATED APPLICATION

This application claims the benefit of Korean Patent Application No. 10-2012-0135392, filed on Nov. 27, 2012, entitled "Contact Pin and Power module Package Having the Same", which is hereby incorporated by reference in its entirety into this application.

BACKGROUND OF THE INVENTION

1. Technical Field

The present invention relates to a contact pin and a power module package having the same.

2. Description of the Related Art

In accordance with the rapid development of a material, a design, and a process for manufacturing a power semiconductor device, a power module package driven by high current and voltage has also been rapidly developed.

The power module package driven by the high current and voltage is configured of a power part and a control part controlling the power part.

In the general power module package, in order to electrically connect the power part and the control part with each other or supply power to the power part, an external connection terminal made of a conductive material is used.

Meanwhile, a structure of a power module package according to the prior art is disclosed in U.S. Pat. No. 5,920,119.

SUMMARY OF THE INVENTION

The present invention has been made in an effort to provide a contact pin that is not separated to the outside after packaging, and a power module having the same.

Further, the present invention has been made in an effort to provide a contact pin capable of maintaining tension at a predetermined level or more after packaging to improve vibration resistance and reliability, and a power module package having the same.

Further, the present invention has been made in an effort to provide a contact pin capable of being used for inputting and outputting large-capacity current, and a power module package having the same.

According to a preferred embodiment of the present invention, there is provided a contact pin including: a deformation part elastically deformed; connection parts coupled to both ends of the deformation part; and contact parts coupled to the connection parts coupled to both ends of the deformation part, respectively, and having one end coupled to the connection part and the other end.

The deformation part may be configured of at least one plate spring.

The deformation part may be configured of two plate springs facing each other, and each of the two plate springs may be bent outwardly.

The other end of the contact part may be formed with at least one protrusion forming a point-contact.

The contact part may be made of any one of carbon steel, stainless steel, aluminum, zinc, and magnesium.

According to another preferred embodiment of the present invention, there is provided a power module package having a contact pin, the power module package including: a first substrate mounted with first semiconductor chips; a second substrate mounted with second semiconductor chips; and a contact pin including a deformation part elastically deformed, connection parts coupled to both ends of the deformation part, and contact parts coupled to the connection parts coupled to both ends of the deformation part, respectively, and having one end coupled to the connection part and the other end, wherein the contact pin is disposed between the first and second substrates to electrically connect the first and second substrates to each other while vertically supporting the first and substrates.

The first and second substrates may have one surface and the other surface, respectively, the first substrate may include chip mounting pads and external connection pads that are formed on one surface thereof; the second substrate may include chip mounting pads formed on one surface thereof and external connection pads formed on the other surface thereof; the first and second semiconductor chips may be mounted on the chip mounting pad on one surface of the first substrate and the chip mounting pad on one surface of the second substrate, respectively, and the contact pin may have one portion and the other portion and be disposed so that a contact part of one portion contacts the external connection pad on one surface of the first substrate and a contact part of the other portion contacts the external connection pad on the other surface of the second substrate.

The first semiconductor chip may be a power device, have one surface and the other surface, and be mounted on the first substrate so that one surface contacts the chip mounting pad on one surface of the first substrate and the other surface is exposed upwardly, the other surface of the first semiconductor chip exposed upwardly may be provided with an electrode receiving a control signal for driving the first semiconductor chip, and the contact pin may be disposed so that the contact parts of one portion and the other portion contact the electrode of the other surface of the first semiconductor chip and the external connection pad of the other surface of the second substrate, respectively.

The first and second substrates may have one surface and the other surface, respectively, the first substrate may include chip mounting pads and external connection pads that are formed on one surface, the second substrate may include chip mounting pads formed on one surface, external connection holes formed so as to penetrate from one surface to the other surface, and conductive layers formed on inner walls of the external connection holes, the first and second semiconductor chips may be mounted on the chip mounting pad on one surface of the first substrate and the chip mounting pad on one surface of the second substrate, respectively, and the contact pin may have one portion and the other portion and be disposed so that a contact part of one portion contacts the external connection pad of one surface of the first substrate and a contact part of the other portion is inserted into the external connection hole of the second substrate.

The first semiconductor chip may be a power device, have one surface and the other surface, and be mounted on the first substrate so that one surface contacts the chip mounting pad on one surface of the first substrate and the other surface is exposed upwardly, the other surface of the first semiconductor chip exposed upwardly may be provided with an electrode receiving a control signal for driving the first semiconductor chip, and the contact pin may be disposed so that the contact part of one portion contacts the electrode of the other surface of the first semiconductor chip and the contact part of the other portion is inserted into the external connection hole of the second substrate.

The power module package may further include: an upper case disposed between the first and second substrates, including contact pin insertion holes corresponding to the contact pin, and formed so that the contact part of the contact pin protrudes to the outside; and a side case disposed between the first and second substrates and covering from a side of the first substrate to a side of the upper case, in a thickness direction.

The upper case may have a first surface facing the first substrate and a second surface facing the second substrate, and an inner wall of the side case may be formed with a step part supporting an edge of the first surface of the upper case.

The power module package may further include a heat radiation plate formed so as to face the other surface of the first substrate and the other surface of the side case, wherein the first substrate has one surface facing the second substrate and the other surface exposed to the outside, and the side case has one surface facing the second substrate and the other surface positioned on the same plane as the other surface of the first substrate.

The power module package may further include a coupling member for coupling the second substrate, the side case, and the heat radiation plate, to each other.

The second semiconductor chip may be a control device controlling the driving of a power device.

The deformation part of the contact pin may be configured of at least one plate spring.

The deformation part of the contact pin may be configured of two plate springs facing each other, and each of the two plate springs may be bent outwardly.

The other end of the contact part of the contact pin may be formed with at least one protrusion forming a point-contact.

The contact part of the contact pin may be made of any one of carbon steel, stainless steel, aluminum, zinc, and magnesium.

BRIEF DESCRIPTION OF THE DRAWINGS

The above and other objects, features and advantages of the present invention will be more clearly understood from the following detailed description taken in conjunction with the accompanying drawings, in which.

DESCRIPTION OF THE PREFERRED EMBODIMENTS

Figure 1:
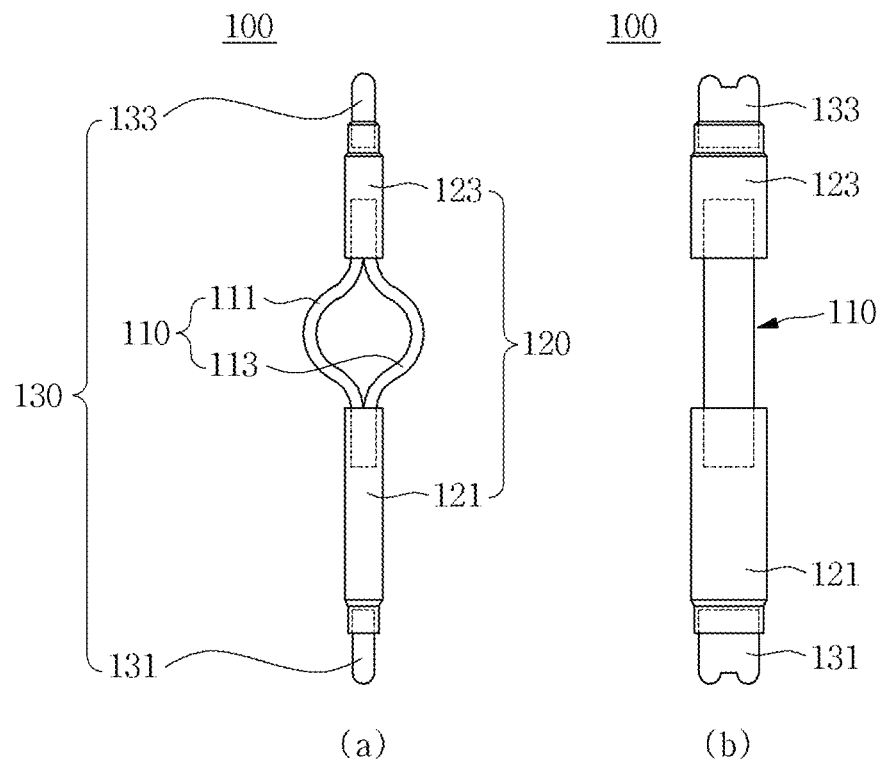
FIGS. 1A and 1B are a cross-sectional view and a side view of a contact pin according to a preferred embodiment of the present invention, respectively.

The objects, features and advantages of the present invention will be more clearly understood from the following detailed description of the preferred embodiments taken in conjunction with the accompanying drawings. Throughout the accompanying drawings, the same reference numerals are used to designate the same or similar components, and redundant descriptions thereof are omitted. Further, in the following description, the terms "first", "second", "one side", "the other side" and the like are used to differentiate a certain component from other components, but the configuration of such components should not be construed to be limited by the terms. Further, in the description of the present invention, when it is determined that the detailed description of the related art would obscure the gist of the present invention, the description thereof will be omitted.

Hereinafter, preferred embodiments of the present invention will be described in detail with reference to the attached drawings.

Contact Pin

Figure 2:
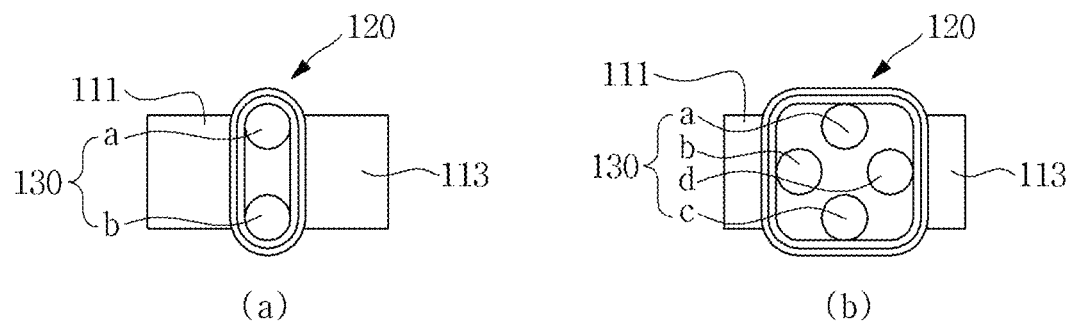
FIGS. 2A and 2B are plan views showing a cross-sectional shape of a contact part in the contact pin of FIG. 1.
Figure 3:
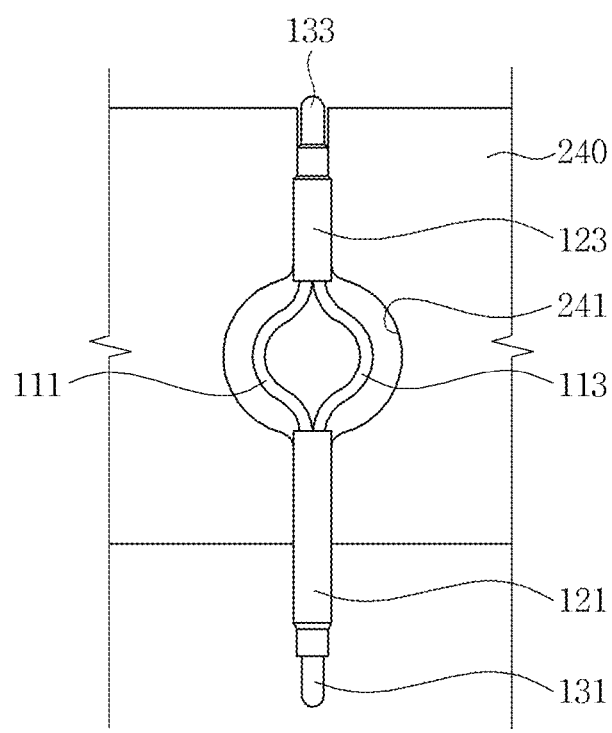
FIG. 3 is a cross-sectional view showing a structure in which the contact pin of FIG. 1 is inserted into an upper case.
Figure 4:
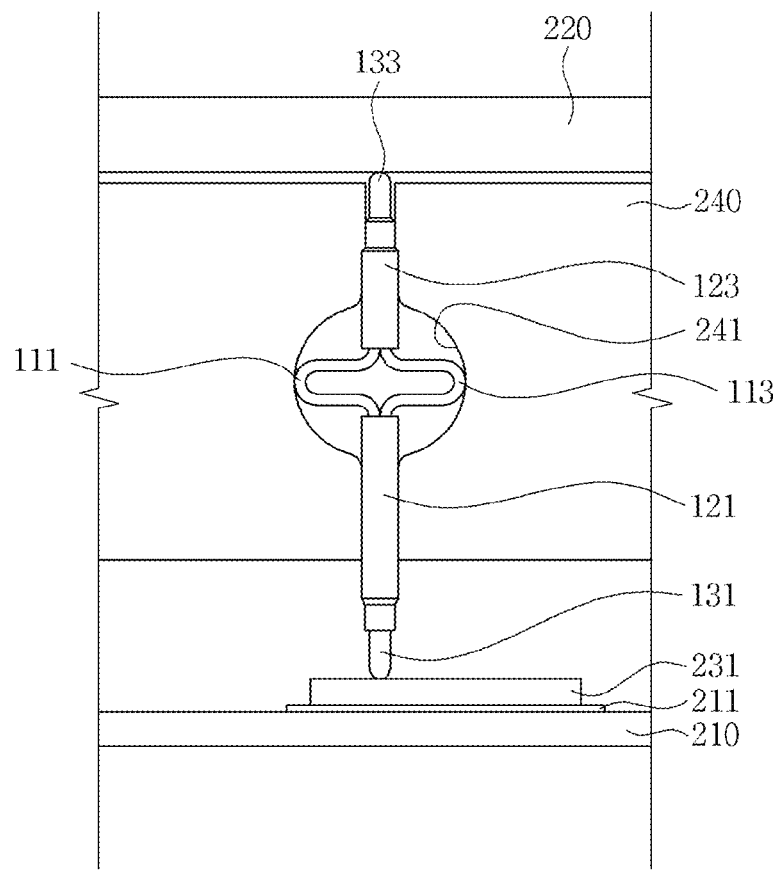
FIG. 4 is a cross-sectional view showing a state in which a deformation part of the contact pin is deformed when pressure is applied to both ends of the contact pin in FIG. 3.

FIGS. 1A and 1B are a cross-sectional view and a side view of a contact pin according to a preferred embodiment of the present invention, respectively; FIGS. 2A and 2B are plan views showing a cross-sectional shape of a contact part in the contact pin of FIG. 1; FIG. 3 is a cross-sectional view showing a structure in which the contact pin of FIG. 1 is inserted into an upper case; and FIG. 4 is a cross-sectional view showing a state in which a deformation part of the contact pin is deformed when pressure is applied to both ends of the contact pin in FIG. 3.

Referring to FIG. 1, the contact pin 100 according to the preferred embodiment of the present invention includes a deformation part 110 elastically deformed, connection parts 120 coupled to both ends of the deformation part 110, respectively, and contact parts 130 coupled to the connection parts 120, respectively.

Here, the deformation part 110 has elasticity, that is, a tendency of allowing a shape of the deformation part to be deformed when pressure is applied and returning to its original shape when the applied pressure is released.

In addition, the deformation part 110 may be configured of at least one plate spring.

More specifically, the case in which the deformation part 110 is configured of two plate springs 111 and 113 is shown in FIG. 1A, but the present invention is not particularly limited thereto.

In this case, the plate springs 111 and 113 may be made of a metal material, but is not particularly limited thereto. Any material may be used as long as the material has conductivity.

Further, in the present embodiment, the two plate springs 111 and 113 configuring the deformation part 110 may have an outwardly bent shape as shown in FIG. 1A, but is not particularly limited thereto.

Furthermore, in the present embodiment, the deformation part 110 has one end and the other end, and the connection parts 121 and 123 may be coupled to one end and the other end, respectively.

Here, the connection parts 121 and 123, which are configurations for connecting the deformation part 110 and contact parts 130 to be described below, may be made of a metal material, but is not particularly limited thereto. Any material may be used as long as the material has conductivity and excellent formability.

In this case, the connection parts 121 and 123 may have one end and the other end, respectively, and one end of each of the connection parts 121 and 123 may be coupled to one end and the other end of the deformation part 110, respectively.

In addition, the other end of each of the connection parts 121 and 123 may be coupled to the contact parts 131 and 133, respectively.

Here, the contact parts 131 and 133, which are parts contacting a first substrate 210 mounted with a first semiconductor chip 231 and a second substrate 220 mounted with a second semiconductor chip 233 in a power module package 200 to be described below (See FIG. 5), respectively, may be made of a metal material, but is not particularly limited thereto. Any material may be used as long as the material has conductivity.

In this case, any one of carbon steel, stainless steel, aluminum, zinc, and magnesium may be used as the metal, but the present invention is not particularly limited thereto.

Further, in the present embodiment, the contact parts 131 and 133 may be made of a metal material having low hardness for stable contact, but is not particularly limited thereto.

In addition, the contact parts 131 and 133 have one ends coupled to connect parts 121 and 123 and the other ends contacting the first and second substrates 210 and 220, respectively. Here, at least one protrusions a, b, c, and d point-contacting the first and second substrates 210 and 220 may be formed in the other ends of the contact parts 131 and 133 as shown in FIGS. 2A and 2B, but are not particularly limited thereto.

In this case, the more the number of protrusions a, b, c, and d, the more stable the contact.

Meanwhile, cross sections of the other ends of the contact parts 131 and 133 may be formed in a flat surface so as to surface-contact the first and second substrates 210 and 220, respectively. In this case, the cross-section may be formed in various shapes such as a circular shape, a triangular shape, a rectangular shape, a polygonal shape, or the like.

When pressure is applied to the contact parts 131 and 133 at both sides of the contact pin 100 manufactured in the structure as described above, the shape of the deformation part 110 is deformed (specifically, the plate spring is bent), and when the applied pressure is released, the deformation part 110 returns to its original shape.

A deformation shape of the contact pin 100 as described above is shown in FIGS. 3 and 4.

That is, when an upper case 240 into which the contact pin 100 is inserted as shown in FIG. 3 is packaged with the first and second substrates 210 and 220 disposed at both ends of the contact pin 100 as shown in FIG. 4, pressure is applied to both ends of the contact part 100 by the first and second substrates 210 and 220, the plate springs 111 and 113 of the deformation part 110 may be further bent outwardly as shown in FIG. 4.

Since the deformation part 110 bent as described above has elasticity, force to return to its original shape is generated, such that tension may be maintained at a predetermined level, thereby making it possible to improve vibration-resistance and reliability of a product after packaging.

Power Module Package Having Contact Pin

Figure 5:
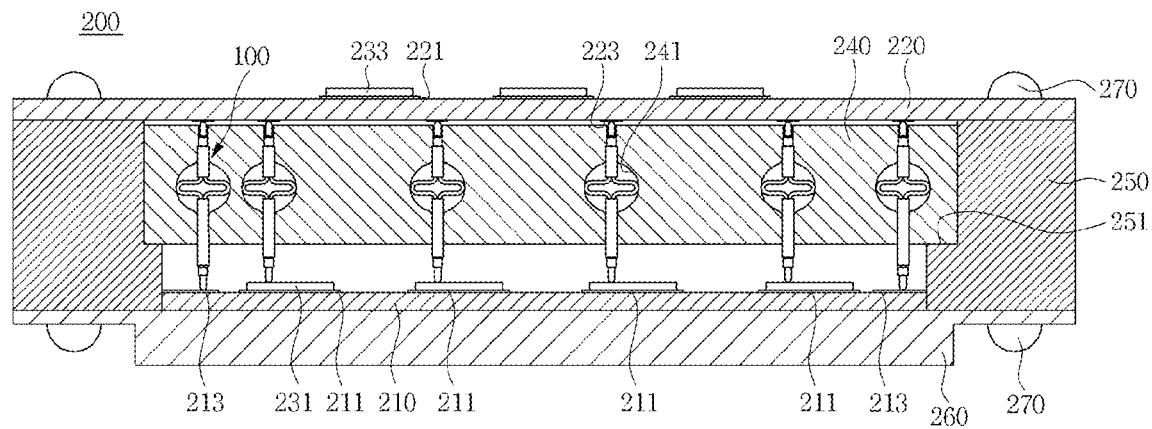
FIG. 5 is a cross-sectional view showing a power module package having a contact pin according to the preferred embodiment of the present invention.
Figure 6:
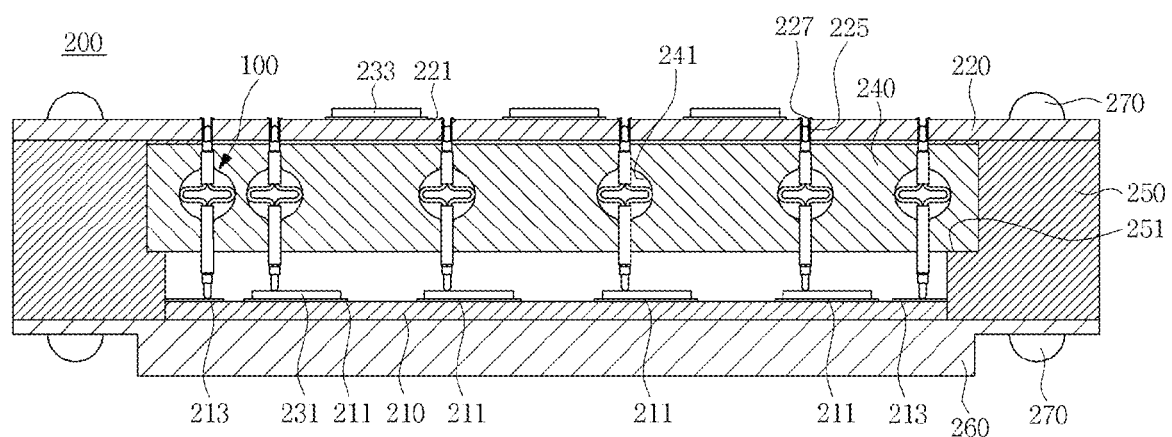
FIG. 6 is a cross-sectional view showing another embodiment of a connection structure between a second substrate and the contact pin in FIG. 5.

FIG. 5 is a cross-sectional view showing a power module package having a contact pin according to the preferred embodiment of the present invention; and FIG. 6 is a cross-sectional view showing another embodiment of a connection structure between a second substrate and the contact pin in FIG. 5.

Meanwhile, since a description of each component of the contact pin was provided in the "contact pin" part, the description will be omitted in the present embodiment.

Referring to FIG. 5, the power module package 200 having a contact pin according to the present embodiment includes a first substrate 210 mounted with first semiconductor chips 231, a second substrate 220 mounted with second semiconductor chips 233, and a contact pin configured of a deformation part 110 elastically deformed, connection parts 120 coupled to both ends of the deformation part 110, respectively, and contact parts 130 coupled to the connection parts 120, respectively.

In this case, the first and second substrates 210 and 220 may be disposed to face each other in a vertical direction, the contact pin 100 may be disposed between the first and second substrates 210 and 220 disposed to face each other in the vertical direction to electrically connect the first and second substrates 210 and 220 to each other while mechanically supporting them.

As the first substrate 210, which is a substrate having the first semiconductor chips 231 mounted thereon, a metal substrate having an anodic oxide layer, a metal substrate including an insulating layer formed on one surface thereof; a printed circuit board (PCB), a ceramic substrate, a directed bonded copper (DBC) substrate, or the like, may be used in the present embodiment, but the present invention is not particularly limited thereto.

Here, the metal substrate may be made of, for example, aluminum (Al) which is a metal material capable of being easily obtained at a relatively low cost and has significantly excellent heat transfer characteristics, or an alloy thereof.

In this case, since the metal substrate has significantly excellent heat transfer characteristics to serve as a heat radiation member radiating heat discharged from the first semiconductor chips 231, it may not require a separate heat radiation member.

In addition, the anodic oxide layer, which is formed, for example, by immersing the metal substrate made of aluminum or an alloy thereof in an electrolyte solution such as boric acid, phosphoric acid, sulfuric acid, chromic acid, or the like, and then applying an anode to the metal substrate and applying a cathode to the electrolyte solution, has insulation characteristics and relatively high heat transfer characteristics of about 10 to 30 W/mk.

Here, in the case in which the metal substrate is made of aluminum or an alloy thereof; the anodic oxide layer may be alumina ($Al_2O_3$).

In addition, since the anodic oxide layer has an insulation property, a circuit layer may be formed on the first substrate 210. Further, since the anodic oxide layer may be formed at a thickness thinner than that of a general insulating layer, a distance between the metal substrate and the first semiconductor chip 231 may be reduced, thereby making it possible to thin the power module package simultaneously with further improving heat radiation performance.

In addition, the first substrate 210 has one surface and the other surface, and one surface of the first substrate may be provided with chip mounting pads 211 and external connection pads 213.

Here, a circuit pattern for supplying power to the first semiconductor chip 231 mounted on one surface of the first substrate 210, a circuit pattern for transferring a control signal driving the first semiconductor chip 231, or the like, may be connected to the external connection pad 213.

In addition, according to the present embodiment, the first semiconductor chip 231 may be a power device, but is not particularly limited thereto.

The power device may include a silicon controlled rectifier (SCR), a power transistor, an insulated gate bipolar transistor (IGBT), a metal oxide semiconductor (MOS) transistor, a power rectifier, a power regulator, an inverter, a converter, or a high power semiconductor chip or diode including a combination thereof.

In addition, the first semiconductor chip 231 has one surface and the other surface and may be mounted on one surface of the first substrate 210 so as to allow the one surface thereof to contact the chip mounting pad 211 formed on one surface of the first substrate 210.

Here, an adhesive layer (not shown) may be formed between the first semiconductor chip 231 and the chip mounting pad 211. This adhesive layer (not shown) may be made of solder or conductive epoxy having relatively high thermal conductivity in order to effectively radiate heat, but is not particularly limited thereto.

Further, according to the present embodiment, the second substrate 220 may be a printed circuit board (PCB), but is not particularly limited thereto.

Meanwhile, although FIG. 5 shows that the second substrate 220 is a single-layer printed circuit board for simplification of the drawing, the second substrate 220 may be a multi-layer printed circuit board.

In addition, the second substrate 220 has one surface and the other surface, wherein one surface may be provided with chip mounting pads 221, and the other surface may be provided with external connection pads 223 capable of being electrically connected to the first substrate 210.

In addition, according to the present embodiment, the second semiconductor chip 233 may be a control device controlling the driving of the power device, but is not particularly limited thereto.

Further, the second semiconductor chip 233 has one surface and the other surface and may be mounted on one surface of the second substrate 220 so as to allow the one surface thereof to contact the chip mounting pad 221 formed on one surface of the second substrate 220.

Here, an adhesive layer (not shown) may be formed between the second semiconductor chip 233 and the chip mounting pad 221. This adhesive layer (not shown) may be made of solder or conductive epoxy having relatively high thermal conductivity in order to effectively radiate heat, but is not particularly limited thereto.

Meanwhile, a structure of a second substrate 220 according to another preferred embodiment of the present invention is shown in FIG. 6.

According to the present embodiment, the second substrate 220 has one surface and the other surface and may include chip mounting pads 211 formed on one surface thereof; external connection holes 225 formed so as to penetrate from one surface to the other surface, and conductive layers 227 formed on inner walls of the external connection holes 225 as shown in FIG. 6.

In this case, a contact part 133 of a contact pin 100 is inserted into the external connection hole 225, and a connection part 123 coupled to the contact part 133 has a diameter larger than that of the external connection hole 225, as shown in FIG. 6, such that the connection part 123 may serve as catching jaw to maintain a contact state of the contact pin 100.

Further, the contact pin 100 may include a deformation part 110 elastically deformed by pressure, the connection parts 120 coupled to both ends of the deformation part 110, and the contact parts 130 coupled to the connection parts to contact the first and second substrates 210 and 220, respectively, as described above.

According to the present embodiment, the contact pin 100 may be disposed between the first and second substrates 210 and 220 so that the contact part 131 of one portion and the contact part 133 of the other portion contact the external connection pad 213 on one surface of the first substrate 210 and the external connection pad 223 of the other surface of the second substrate 220, respectively, as shown in FIG. 5. Here, the external connection pads 213 and 223 and the contact parts 131 and 133 may maintain a contact state even though they are not adhered to each other by a separate adhesive.

The reason is that since the deformation part 110 of the contact pin 100 deformed by pressure applied from the first and second substrates 210 and 220 has elasticity, force to return to its original shape is generated, and tension may be maintained at a predetermined level or more by the generated force.

Meanwhile, in the case of the structure in FIG. 6, the contact part 133 of the other portion of the contact pin 100 is inserted into the external connection hole 225, such that pressure is not applied to the contact part 133. However, since the connection part 123 coupled to the contact part 133 has the diameter larger than that of the external connection hole 225, the connection part 123 is not inserted into the external connection hole 225 and caught by the other surface of the second substrate 220, pressure may be applied to the deformation part 110 of the contact pin 100 through the connection part 123.

In addition, according to the present embodiment, in the case in which the first semiconductor chip 231 mounted on one surface of the first substrate 210 is a power device, the first semiconductor chip 231 may have an electrode receiving power and an electrode receiving a driving control signal on one surface and the other surface thereof; respectively.

In this case, the first semiconductor chip 231 may be mounted on one surface of the first substrate 210 so that the electrode receiving the driving control signal is exposed upwardly, and the contact pin 100 may be disposed so that the contact part 131 of one portion and the contact part 133 of the other portion contact the electrode of the first semiconductor chip 231 and the external connection pad 223 of the other portion of the second substrate 220, respectively.

Therefore, the driving control signal outputted from the second semiconductor chip 233, which is the control device mounted on one surface of the second substrate 220 may be transferred to the first semiconductor chip 231 through the contact pin 100.

In addition, the contact part 131 of the contact pin 100 may also directly contact the electrode of the first semiconductor chip 231 receiving the power.

Alternately, a circuit pattern connected to the electrode of the first semiconductor chip 231 receiving the power and the external connection pad 213 formed on one surface of the first substrate 210 are connected to each other, such that the contact part 131 of the contact pin 100 may contact the external connection pad 213.

In the case in which the first semiconductor chip 231 is the power device, large-capacity current may be inputted into and outputted from the first semiconductor chip 231. The contact pin 100 according to the present embodiment, that is, the contact pin 100 including the plate spring having a wide area is used, such that an area of a portion to which current may flow may increase, and the large-capacity current may be inputted and outputted.

In addition, the power module package 200 having a contact pin according to the preferred embodiment of the present invention may further include an upper case 240 disposed between the first and second substrates 210 and 220 that are disposed to face each other in the vertical direction and including contact pin insertion holes 241 having a shape corresponding to the contact pin 100 and a side case 250 disposed between the first and second substrates 210 and 220 and covering from a side surface of the first substrate 210 to a side surface of the upper case 240 in a thickness direction.

Here, the upper case 240 may have an appropriate thickness so that the contact parts 131 and 133 of the contact pin 100 may protrude to the outside.

The reason is that the contact parts 131 and 133 of the contact pin 100 need to contact the first and second substrates 210 and 220, respectively.

In addition, a portion of the contact pin insertion hole 241 corresponding to the deformation part 110 of the contact pin 100 may be formed to have a size corresponding to that of the deformation part 110 when the deformation part 110 is deformed.

In addition, the upper case 240 may have a first surface facing the first substrate 210 and a second surface facing the second substrate 220, and an inner surface of the side case 250 may be formed with a step part 251 supporting an edge of the first surface of the upper case 240, but is not particularly limited thereto.

In addition, the side case 250 may have one surface contacting the second substrate 220 and the other surface positioned on the same plane as the other surface of the first substrate 210.

Further, the power module package 200 having a contact pin according to the preferred embodiment of the present invention may further include a heat radiation plate 260 formed so as to contact the other surface of the first substrate 210 and the other surface of the side case 250.

Here, the heat radiation plate 260, which is attached to the first substrate 210 in order to radiate heat generated from the first semiconductor chip 231 in the air, may include a plurality of heat radiation pins.

In addition, the heat radiation plate 260 is generally made of a copper (Cu) material or a tin (Sn) material or formed by coating the copper (Cu) material or the tin (Sn) material, but is not particularly limited thereto. The reason is that the copper (Cu) material or the tin (Sn) material excellently transfers heat and facilitates bonding between the heat radiation plate 260 and the first substrate 210.

Further, the power module package 200 having a contact pin according to the preferred embodiment of the present invention may further include a coupling member 270 for coupling the second substrate 220, the side case 250, and the heat radiation plate 260 to each other as shown in FIG. 5.

According to the present invention, since the contact pin may maintain tension at a predetermined level or more after packaging by using the contact pin having the deformation part elastically deformed corresponding to pressure, although a separate coupling member is not used, the contact pin may not be separated and maintain a contact state, thereby facilitating the packaging.

In addition, as set forth above, according to the present invention, the contact pin may maintain tension at a predetermined level or more after packaging, the vibration resistance and reliability of the product may be improved.

Further, according to the present invention, the contact pin including the plate spring having the wide area is used, such that the area of the portion to which the current flows may increase, large-capacity current may be inputted into and outputted from the power module package.

Although the embodiments of the present invention have been disclosed for illustrative purposes, it will be appreciated that the present invention is not limited thereto, and those skilled in the art will appreciate that various modifications, additions and substitutions are possible, without departing from the scope and spirit of the invention.

Accordingly, any and all modifications, variations or equivalent arrangements should be considered to be within the scope of the invention, and the detailed scope of the invention will be disclosed by the accompanying claims.

What is claimed is:

1. A power module package having a contact pin, the power module package comprising: a first substrate mounted with first semiconductor chips; a second substrate mounted with second semiconductor chips; and a contact pin including a deformation part elastically deformed, connection parts coupled to both ends of the deformation part, and contact parts coupled to the connection parts coupled to both ends of the deformation part, respectively, and having one end coupled to the connection part and the other end, wherein: the contact pin is disposed between the first and second substrates to electrically connect the first and second substrates to each other while vertically supporting the first and substrates, the first and second substrates have one surface and the other surface, respectively, the first substrate includes chip mounting pads and external connection pads that are formed on one surface thereof, the second substrate includes chip mounting pads formed on one surface thereof and external connection pads formed on the other surface thereof, the first and second semiconductor chips are mounted on the chip mounting pad on one surface of the first substrate and the chip mounting pad on one surface of the second substrate, respectively, and the contact pin has one portion and the other portion and is disposed so that a contact part of one portion contacts the external connection pad on one surface of the first substrate and a contact part of the other portion contacts the external connection pad on the other surface of the second substrate, wherein the first semiconductor chip is a power device, has one surface and the other surface, and is mounted on the first substrate so that one surface contacts the chip mounting pad on one surface of the first substrate and the other surface is exposed upwardly, the other surface of the first semiconductor chip exposed upwardly is provided with an electrode receiving a control signal for driving the first semiconductor chip, and the contact pin is disposed so that the contact parts of one portion and the other portion contact the electrode of the other surface of the first semiconductor chip and the external connection pad of the other surface of the second substrate, respectively.

2. The power module package as set forth in claim 1, wherein the first and second substrates have one surface and the other surface, respectively, the first substrate includes chip mounting pads and external connection pads that are formed on one surface, the second substrate includes chip mounting pads formed on one surface, external connection holes formed so as to penetrate from one surface to the other surface, and conductive layers formed on inner walls of the external connection holes, the first and second semiconductor chips are mounted on the chip mounting pad on one surface of the first substrate and the chip mounting pad on one surface of the second substrate, respectively, and the contact pin has one portion and the other portion and is disposed so that a contact part of one portion contacts the external connection pad of one surface of the first substrate and a contact part of the other portion is inserted into the external connection hole of the second substrate.

3. The power module package as set forth in claim 2, wherein the first semiconductor chip is a power device, has one surface and the other surface, and is mounted on the first substrate so that one surface contacts the chip mounting pad on one surface of the first substrate and the other surface is exposed upwardly, the other surface of the first semiconductor chip exposed upwardly is provided with an electrode receiving a control signal for driving the first semiconductor chip, and the contact pin is disposed so that the contact part of one portion contacts the electrode of the other surface of the first semiconductor chip and the contact part of the other portion is inserted into the external connection hole of the second substrate.

4. The power module package as set forth in claim 1, further comprising:
- an upper case disposed between the first and second substrates, including contact pin insertion holes corresponding to the contact pin, and formed so that the contact part of the contact pin protrudes to the outside; and
- a side case disposed between the first and second substrates and covering from a side of the first substrate to a side of the upper case, in a thickness direction.

5. The power module package as set forth in claim 4, wherein the upper case has a first surface facing the first substrate and a second surface facing the second substrate, and
- an inner wall of the side case is formed with a step part supporting an edge of the first surface of the upper case.

6. The power module package as set forth in claim 5, further comprising: a heat radiation plate formed so as to face the other surface of the first substrate and the other surface of the side case,
- wherein the first substrate has one surface facing the second substrate and the other surface exposed to the outside, and
- the side case has one surface facing the second substrate and the other surface positioned on the same plane as the other surface of the first substrate.

7. The power module package as set forth in claim 6, further comprising a coupling member for coupling the second substrate, the side case, and the heat radiation plate, to each other.

8. The power module package as set forth in claim 1, wherein the second semiconductor chip is a control device controlling the driving of a power device.

9. The power module package as set forth in claim 1, wherein the deformation part of the contact pin is configured of two plate springs.

10. The power module package as set forth in claim 1, wherein the deformation part of the contact pin is configured of two plate springs facing each other, and each of the two plate springs is bent outwardly.

11. The power module package as set forth in claim 1, wherein the other end of the contact part of the contact pin is formed with at least one protrusion forming a point-contact.

12. The power module package as set forth in claim 1, wherein the contact part of the contact pin is made of any one of carbon steel, stainless steel, aluminum, zinc, and magnesium.

* * * * *